(12) United States Patent
Ahn et al.

(10) Patent No.: US 9,373,820 B2
(45) Date of Patent: Jun. 21, 2016

(54) SUBSTRATE FOR ORGANIC ELECTRONIC DEVICE

(71) Applicant: LG CHEM, LTD., Seoul (KR)

(72) Inventors: Yong Sik Ahn, Daejeon (KR); Jin Woo Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/609,026

(22) Filed: Jan. 29, 2015

(65) Prior Publication Data

US 2015/0144931 A1    May 28, 2015

Related U.S. Application Data

(63) Continuation of application No. PCT/KR2013/006907, filed on Jul. 31, 2013.

(30) Foreign Application Priority Data

Jul. 31, 2012  (KR) .......................... 10-2012-0084212
Jul. 31, 2013  (KR) .......................... 10-2013-0091011

(51) Int. Cl.
*H01L 27/146*    (2006.01)
*H01L 51/52*    (2006.01)
*H01L 51/00*    (2006.01)
*G02B 5/02*    (2006.01)

(52) U.S. Cl.
CPC .......... *H01L 51/5268* (2013.01); *G02B 5/0221* (2013.01); *G02B 5/0226* (2013.01); *H01L 51/0096* (2013.01); *H01L 51/5275* (2013.01); H01L 51/524 (2013.01); H01L 2251/5361 (2013.01); H01L 2251/5369 (2013.01); Y10T 428/24355 (2015.01); Y10T 428/24893 (2015.01)

(58) Field of Classification Search
CPC .................. H01L 51/0096; H01L 2251/5369; G02B 5/0226
USPC ............................. 257/258; 977/932; 428/206
See application file for complete search history.

(56) References Cited

U.S. PATENT DOCUMENTS

| 4,720,432 A | 1/1988 | VanSlyke et al. | |
| 2006/0175962 A1* | 8/2006 | Fujimoto | H01L 27/3211 313/506 |
| 2010/0165276 A1* | 7/2010 | David | C08J 7/123 349/122 |
| 2011/0266577 A1 | 11/2011 | Kim et al. | |
| 2012/0305966 A1* | 12/2012 | Shin | H01L 51/0096 257/98 |
| 2014/0042422 A1* | 2/2014 | Silverman | H01L 51/5275 257/40 |

FOREIGN PATENT DOCUMENTS

| CN | 1755960 A | 4/2006 |
| CN | 101064357 A | 10/2007 |
| JP | 2-88689 A | 3/1990 |

(Continued)

*Primary Examiner* — Caridad Everhart
(74) *Attorney, Agent, or Firm* — Dentons US LLP

(57) ABSTRACT

The present application relates to a substrate for an organic electronic device, an organic electronic device, and a lighting device. In an embodiment of the present application, a substrate or an organic electronic device which may form an organic electronic device capable of ensuring performance including light extraction efficiency or the like and reliability by applying a scattering layer capable of exhibiting different scattering properties according to an angle of incident light may be provided.

19 Claims, 3 Drawing Sheets

(56) References Cited

FOREIGN PATENT DOCUMENTS

| | | |
|---|---|---|
| JP | 2-196885 A | 8/1990 |
| JP | 2-250292 A | 10/1990 |
| JP | 2-255789 A | 10/1990 |
| JP | 2-289676 A | 11/1990 |
| JP | 3-296595 A | 12/1991 |
| JP | 4-96990 A | 3/1992 |
| JP | 5-9470 A | 1/1993 |
| JP | 5-17764 A | 1/1993 |
| JP | 5-202011 A | 8/1993 |
| JP | 6-49079 A | 2/1994 |
| JP | 6-88072 A | 3/1994 |
| JP | 6-92947 A | 4/1994 |
| JP | 6-100857 A | 4/1994 |
| JP | 6-107648 A | 4/1994 |
| JP | 6-132080 A | 5/1994 |
| JP | 6-145146 A | 5/1994 |
| JP | 6-203963 A | 7/1994 |
| JP | 6-206865 A | 7/1994 |
| JP | 6-207170 A | 7/1994 |
| JP | 6-279322 A | 10/1994 |
| JP | 6-279323 A | 10/1994 |
| JP | 6-293778 A | 10/1994 |
| JP | 7-157473 A | 6/1995 |
| JP | 7-179394 A | 7/1995 |
| JP | 7-228579 A | 8/1995 |
| JP | 7-278124 A | 10/1995 |
| JP | 8-22557 A | 1/1996 |
| JP | 8-81472 A | 3/1996 |
| JP | 2597377 A | 1/1997 |
| JP | 2651233 B2 | 5/1997 |
| JP | 2004-273416 A | 9/2004 |
| JP | 2006-221976 A | 8/2006 |
| JP | 2007-69603 A | 3/2007 |
| JP | 2007-258113 A | 10/2007 |
| JP | 2009-217292 A | 9/2009 |
| KR | 10-2009-0019752 A | 2/2009 |
| KR | 10-2010-0063729 A | 6/2010 |
| KR | 10-2010-0078354 A | 7/2010 |
| KR | 10-2012-0024510 A | 3/2012 |

\* cited by examiner

SUBSTRATE FOR ORGANIC ELECTRONIC DEVICE

This application is Bypass Continuation Application of PCT/KR2013/006907, filed on Jul. 31, 2013, which claims priority to and the benefit of Korean Patent Application Nos. 10-2012-0084212, filed on Jul. 31, 2012 and 10-2013-0091011, filed on Jul. 31, 2013, all of which are incorporated herein by reference in their entirety.

TECHNICAL FIELD

The present application relates to a substrate for an organic electronic device, an organic electronic device, and a lighting device.

BACKGROUND ART

An organic electronic device (OED) is a device which exhibits a function through a charge exchange between an electrode layer and an organic material, and for example, includes an organic light emitting device (OLED), an organic solar cell, an organic photo conductor (OPC), an organic transistor or the like.

An OLED, which is a representative organic electronic device, generally includes a substrate, a first electrode layer, an organic layer including a light-emitting layer, and a second electrode layer sequentially.

In a structure referred to as a so-called bottom emitting device, the first electrode layer may be formed of a transparent electrode layer, and the second electrode layer may be formed of a reflective electrode layer. Further, in a structure referred to as a so-called top emitting device, the first electrode layer may be formed of a reflective electrode layer, and the second electrode layer may be formed of a transparent electrode layer.

Electrons and holes each are injected from the two electrode layers, and the injected electrons and holes recombine in the light-emitting layer to generate light. The light may be emitted to the substrate side in the bottom emitting device, and light may be emitted to the second electrode layer side in the top emitting device.

In the structure of the OLED, refractive indexes of indium tin oxide (ITO) which is generally used as a transparent electrode layer, an organic layer, and a substrate which is generally formed of a glass are approximately 2.0, 1.8 and 1.5, respectively. By the relationship of the above-described refractive indexes, for example, light generated in the organic light-emitting layer is trapped in an interface between the organic layer and the first electrode layer, or in the substrate by a total internal reflection phenomenon or the like, and only a very small amount of light is emitted in the bottom emitting device.

DISCLOSURE

Technical Problem

The present application is directed to providing a substrate for an organic electronic device, and an organic electronic device.

Technical Solution

According to an aspect of the present application, an exemplary substrate for an organic electronic device may include a base layer; and a scattering layer. The scattering layer may be, for example, formed on the base layer. FIG. 1 shows an exemplary substrate 100 including the base layer 101 and the scattering layer 102 formed on the base layer 101.

As the base layer, a suitable material may be used without particular limitation. For example, when a bottom emission-type organic light emitting device (OLED) is produced using the substrate, a light-transmitting base layer, for example, such as the base layer having a transmissivity of 50% or more with respect to a field of visible light may be used. An example of the light-transmitting base layer may include a glass base layer or a transparent polymer base layer. An example of the glass base layer may include the base layer including soda lime glass, barium/strontium-containing glass, lead glass, alumino silicate glass, borosilicate glass, barium borosilicate glass, quartz or the like, and an example of the polymer base layer may include the base layer including polycarbonate (PC), an acryl resin, poly(ethylene terephthalate) (PET), poly(ether sulfide) (PES), polysulfone (PS), or the like, but the examples are not limited thereto. Further, as needed, the base layer may be a TFT substrate including a driving TFT.

For example, when a top emission-type OLED is provided using the substrate, the base layer is not necessarily a light-transmitting base layer, and as needed, a reflective base layer in which a reflective layer using aluminum or the like is formed on a surface of the base layer may be used.

A scattering layer including an anisotropic nanostructure may be formed on the base layer. The term "scattering layer" may include all types of the layers configured to scatter, diffuse, or refract incident light.

The scattering layer includes anisotropic nanostructures. FIG. 2 shows an exemplary scattering layer 102 on the base layer 101, which includes an anisotropic nanostructure 1022. As shown in FIG. 2, the scattering layer may further include an overcoat layer 1021 on the nanostructure 1022 as will be described below. The term "anisotropic structure", for example, may be a pillar-shaped structure having an aspect ratio in the range of 1.2 to 30, 1.2 to 25, 1.2 to 20, 1.2 to 15, 1.2 to 10, 1.3 to 10, 1.3 to 9, 1.3 to 8, 1.3 to 7, 1.3 to 6, about 1.3 to 5, or about 1.3 to 4. When the pattern of the anisotropic nanostructure includes two or more structures, an aspect ratio of each structure may be identical or different. The term "aspect ratio" in the present specification may denote a ratio L/D of a largest dimension L of dimensions of the anisotropic nanostructure to a dimension D of the structure defined in a direction perpendicular to a direction in which the largest dimension L is defined. For example, when the structure has a column shape, the aspect ratio may denote a ratio L/D of a length L to a diameter D of a cross section of the column. In the above description, the "anisotropic nanostructure" may denote the anisotropic structure as described above, of which at least one of the largest dimension L and the dimension D of the structure defined in a direction perpendicular to the direction in which the largest dimension L is defined is defined within the range of about 1 to 1,000 nm. For example, the anisotropic nanostructure may have a column shape whose cross section may be formed in various shapes, such as a circular shape, an elliptical shape, a polygonal shape such as a triangular shape, a quadrangular shape or the like, or an amorphous shape. The anisotropic nanostructure, for example, may have a length in the range of about 50 to 1,000 nm, 50 to 900 nm, 50 to 800 nm, 50 to 700 nm, 50 to 600 nm, 50 to 500 nm, 100 to 500 nm, or about 100 to 450 nm. Further, for example, the anisotropic nanostructure may have a cross section having an average diameter in the range of about 10 to 500 nm, 10 to 400 nm, 10 to 300 nm, 20 to 300 nm, 30 to 300 nm, 30 to 300 nm, 50 to 250 nm, 70 to 250 nm, 90 to 250 nm, or 100 to 240 nm.

The anisotropic nanostructure, for example, may be present in the scattering layer while being disposed in a random state. In the above description, a "random disposition" may denote, for example, that intervals between the nanostructures are not uniform when the plurality of anisotropic nanostructures are present. Further, when the pattern of the anisotropic nanostructure includes two or more structures as described above, an aspect ratio of each structure may be identical or different. An average interval of the plurality of anisotropic nanostructures which are randomly disposed may be, for example, in the range of about 150 to 300 nm. In the above-described average interval, an actual interval between the structures may be identical or different. Further, the anisotropic nanostructure may be present such that an area occupied by the nanostructure accounts for about 20% to 70%, about 20% to 60%, about 20% to 50%, or 20% to 40% with respect to an entire area of the scattering layer when observed from an upper side. When the anisotropic structure is disposed as described above, dependence on a specific wavelength is entirely decreased. Further, scattering of a part of light incident to the scattering layer may be minimized and another part of light incident to the scattering layer may be effectively scattered or diffused according to the angle due to a distinct structure of the anisotropic structure.

The anisotropic nanostructure, for example, may have a refractive index higher or lower than the overcoat layer which will be described below. For example, the anisotropic nanostructure may have a difference in the refractive index of about 0.2 to 2.0 or about 0.5 to 2.0 from the overcoat layer. While the nanostructure has a difference in the refractive index as described above, the nanostructure may have the refractive index higher than the overcoat layer. Unless otherwise defined, the term "refractive index" in the present specification is a value based on light with the wavelength of 550 nm or 633 nm.

The anisotropic nanostructure, for example, may be formed of a transparent insulating material. Examples of the materials capable of forming the anisotropic nanostructure may include zinc oxide (ZnO), zirconia ($ZrO_2$), titania ($TiO_2$), silicon nitride ($Si_3N_4$), silicon nitride oxide ($SiOxNy$), barium oxide (BaO), alumina ($Al_2O_3$), vanadium pentoxide ($V_2O_5$), etc. For example, the anisotropic nanostructure may be formed using a method of etching at least a portion of the layer formed of the above-described material in consideration of a desired pattern after the layer of the above-described material is formed on the base layer using a well-known deposition method. For example, a mask is formed on the material-deposited layer using a method of nanoimprinting, interferometric lithography, or coating, the anisotropic nanostructure is formed by a plasma dry etching method using a gas such as $SF_6$, $Cl_2$, $CF_4$, or the like, the mask is removed, and thereby the pattern of the anisotropic nanostructure may be formed. When a thickness of the deposited layer, a pattern, an etching ratio, or the like of the mask is adjusted in the process, the aspect ratio of the nanostructure or the area occupied by the pattern of the nanostructure may be adjusted.

An overcoat layer may be present on the pattern of the anisotropic nanostructure. The overcoat layer, for example, may have a refractive index in the range of about 1.2 to 3.5, 1.2 to 3, 1.2 to 2.5, 1.2 to 2.5, or 1.2 to 2.2.

As the overcoat layer, for example, various well-known organic materials, inorganic materials, or organic and inorganic materials may be used. In consideration of the lifetime of the device or excellent resistance with respect to a high temperature process, a photolithography process, or an etching process performed in the manufacturing process, inorganic materials, or organic and inorganic materials which have excellent heat resistance and chemical resistance may be used, but organic materials may also be used as needed. Examples of the materials which forms the overcoat layer may include, for example, a polyimide, a caldo resin having a fluorene ring, urethane, epoxide, a polyester-based or acrylate-based thermosetting or photocurable monomer, oligomer or polymer organic material, an inorganic material such as oxide silicon, silicon nitride, silicon oxynitride, polysiloxane, or the like, organic and inorganic composite materials, etc.

For example, the overcoat layer may include a polysiloxane, a polyamic acid or, a polyimide. The polysiloxane, for example, may be formed through polycondensation of a condensable silane compound, a siloxane oligomer, or the like, and the overcoat layer formed as described above may be formed in a matrix type based on a combination of silicon and oxygen (Si—O). As needed, the overcoat layer in which a polysiloxane is only based on a combination of siloxane (Si—O), or the overcoat layer in which a part of an organic group such as an alkyl group or the like or a condensable functional group such as an alkoxy group or the like is remaining may be formed by adjusting condensation conditions.

As the polyamic acid or polyimide binder, for example, a binder having a refractive index of about 1.5 or more, about 1.6 or more, about 1.65 or more, or about 1.7 or more with respect to light with the wavelength of 550 nm or 633 nm may be used. The above-described polyamic acid or polyimide, for example, may be formed using a monomer to which halogen atoms besides fluorine, sulfur atoms, phosphorus atoms, or the like are introduced.

As the binder, for example, a polyamic acid which has a part which may be combined with particles such as a carboxyl group or the like, thus leading to an improvement of distribution stability of the particles may be used.

As the polyamic acid, for example, a compound including a repeating unit of the following Formula 1 may be used.

[Formula 1]

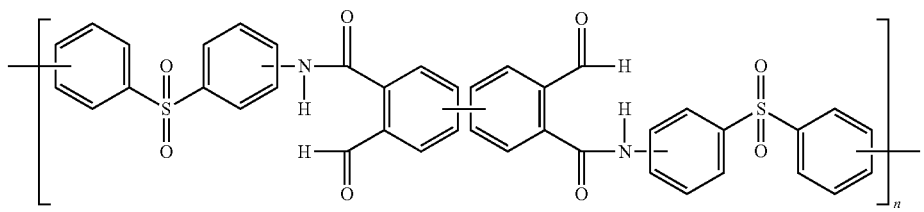

In Formula 1, n is a positive number.

The repeating unit may be arbitrarily substituted with one or more substituents. Examples of the substituents may include a functional group including such as halogen atoms besides fluorine, halogen atoms such as a phenyl group, a benzyl group, a naphthyl group, a thiophenyl group, or the like including halogen atoms, sulfur atoms, phosphorus atoms, or the like.

The polyamic acid may be a homopolymer only formed with the repeating unit of Formula 1, or a copolymer including another unit in addition to the repeating unit of Formula 1. In the copolymer, a type or ratio of another unit, for example, may be suitably selected within a range which does not decrease a desired refractive index, heat resistance, light transmission ratio, etc.

As a specific example of the repeating unit of Formula 1, a repeating unit of the following Formula 2 may be exemplified.

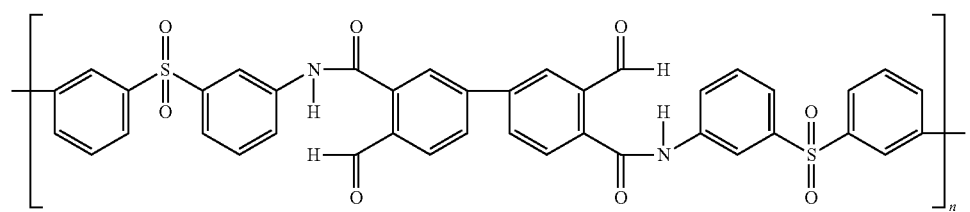

[Formula 2]

In Formula 2, n is a positive number.

The polyamic acid, for example, may have a weight-average molecular weight in the range of 10,000 to 100,000 or about 10,000 to 50,000 which is measured and converted based on standard polystyrene using gel permeation chromatography (GPC). Further, the polyamic acid having the repeating unit of Formula 1 may have a light transmission ratio of 80% or more, 85% or more, or 90% or more in a visible ray region, and have excellent heat resistance.

Further, the overcoat layer may additionally include high refractive particles as needed. For example, a refractive index of the overcoat layer may be adjusted by using high refractive particles. The term "high refractive particles", for example, may denote particles having a refractive index of 1.5 or more, 2.0 or more 2.5 or more, 2.6 or more, or 2.7 or more. The upper limit of the refractive index of high refractive particles, for example, may be selected within a range which satisfies the above-described refractive index of the overcoat layer in consideration of the refractive index of the overcoat layer which is combined together with the particles. The high refractive particles, for example, may have an average diameter in the range of about 1 to 100 nm, 10 to 90 nm, 10 to 80 nm, 10 to 70 nm, 10 to 60 nm, 10 to 50 nm, or 10 to 45 nm. Examples of the high refractive particles may include alumina, alumino silicate, titanium oxide, zirconium oxide, etc.

A ratio of the high refractive particles is not particularly limited, and may be adjusted within the above-described range which ensures the refractive index of the overcoat layer.

A thickness of the overcoat layer is also not particularly limited, and may be adjusted within a suitable range according to the need.

After an anisotropic nanostructure is formed, for example, the overcoat layer may be formed using a deposition method such as a wet coating method, a sol-gel method, a chemical vapor deposition (CVD) method, a physical vapor deposition (PVD) method, etc.

The substrate may further include an electrode layer. For example, the electrode layer may be formed on the scattering layer. As the electrode layer, for example, a hole injecting or electron injecting electrode layer used in generally producing an organic electronic device such as an OLED or the like may be formed.

The hole injecting electrode layer, for example, may be formed of a material having a relatively high work function, and may be formed of a transparent material as needed. For example, the hole injecting electrode layer may include a metal, an alloy, an electroconductive compound, which have a work function of about 4.0 eV or more, or a mixture of two types or more thereof. Examples of the material may include a metal such as gold, CuI, an oxide material such as indium tin oxide (ITO), indium zinc oxide (IZO), zinc tin oxide (ZTO), zinc oxide doped with aluminum or indium, magnesium indium oxide, nickel tungsten oxide, ZnO, $SnO_2$, $In_2O_3$, or the like, a metal nitride such as gallium nitride, a metal selenide such as zinc selenide or the like, a metal sulfide such as zinc sulfide, etc. Further, the transparent hole injecting electrode layer may be formed using a metal thin layer including Au, Ag, Cu, or the like, a laminate of high refractive transparent materials including ZnS, $TiO_2$, ITO, etc.

The hole injecting electrode layer may be formed using an arbitrary process such as deposition, sputtering, chemical deposition, an electrochemical process, etc. Further, the formed electrode layer may be patterned through a process using well-known photolithography, a shadow mask, or the like according to the needs. A layer thickness of the hole injecting electrode layer varies according to a light transmission ratio, surface resistivity, or the like, but may be generally 500 nm, or in the range of 10 to 200 nm.

The transparent electron injecting electrode layer, for example, may be formed of a transparent material with a relatively low work function, for example, a suitable material in the materials used to form the hole injecting electrode layer may be used to form the transparent electron injecting electrode layer, but the transparent electron injecting electrode layer is not limited thereto. The electron injecting electrode layer, for example, may also be formed using a deposition method, a sputtering method, or the like, and may be suitably patterned as needed. The electron injecting electrode layer may be formed with a suitable thickness according to the needs.

When the electrode layer is formed, the scattering layer may have a projected area smaller than the electrode layer. Here, the scattering layer may also have a projected area smaller than the base layer. In the present specification, the term "projected area" may denote a projected area of the object perceived when the substrate is observed from an upper side or lower side of the direction parallel to the normal direction of the surface of the substrate, and for example, may denote an area of the base layer, scattering layer, or electrode layer. Accordingly, for example, even when a substantive surface area of the scattering layer is wider than that of the electrode layer for the reason that the surface of the scattering layer is formed in a convexo-concave shape, when the area perceived when the scattering layer is observed from an upper side is smaller than the area perceived when the electrode layer is observed from an upper side, the scattering layer is construed as having a projected area smaller than the electrode layer.

When the scattering layer or the like has a projected area smaller than the base layer, and the projected area of the scattering layer is even smaller than that of the electrode layer, the scattering layer may be present in various shapes. For example, as shown in FIG. 3, the scattering layer 102 may be formed on a part except for the boundary of the base layer 101, or a part of the scattering layer may remain on the boundary of the base layer, etc.

FIG. 4 is an exemplary view showing the case in which the substrate of FIG. 3 is observed from the upper part. As shown in FIG. 3, the area A of the electrode layer 201 perceived when the substrate is observed from the upper side, that is, the projected area A of the electrode layer 201 is greater than the projected area B of the scattering layer 102 present at a lower side of the electrode layer 201. A ratio A/B of the projected area A of the electrode layer 201 to the projected area B of the scattering layer 102 may be, for example, 1.04 or more, 1.06 or more, 1.08 or more, 1.1 or more, or 1.15 or more. When the projected area of the scattering layer 102 is smaller than the projected area of the electrode layer, a structure in which the scattering layer is not exposed to the outside as will be described below may be realized, and thus the upper limit of the ratio A/B of the projected area is not particularly limited. In consideration of a general production environment of the substrate, the upper limit of the ratio A/B may be, for example, about 2.0, about 1.5, about 1.4, about 1.3, or about 1.25. On the substrate, the electrode layer may also be formed on the substrate on which the scattering layer is not formed. The electrode layer may be formed in contact with the base layer, or may be formed to include an additional factor between the base layer and the electrode layer. By the above-described structure, the structure in which the scattering layer is not exposed to the outside may be realized when the organic electronic device is realized.

For example, as shown in FIG. 4, the electrode layer 201 may be formed to an area including out of the peripheral sections of the scattering layer 102. Here, for example, when the plurality of scattering layers are present on the base layer, the electrode layer may be formed to an area including out of the peripheral sections of at least one scattering layer, for example, at least the scattering layer on which the organic layer is formed. In the above-described structure, the structure in which the scattering layer is not exposed to the outside may be formed using a method of attaching an encapsulating structure which will be described below to the electrode layer not having the scattering layer thereunder. Accordingly, the scattering layer may be prevented from being a penetration path for external moisture, oxygen, or the like, an adhesion force of the encapsulating structure or the electrode and the substrate may be stably ensured, and surface hardness of the outer part of the device may be excellently maintained.

According to another aspect of the present application, there is provided an organic electronic device. An exemplary organic electronic device of an embodiment of the present application may include the substrate for the organic electronic device, and the organic electronic device formed on the substrate, for example, the scattering layer of the substrate. The organic electronic device, for example, may include a first electrode layer, an organic layer, and a second electrode layer sequentially formed on the scattering layer. In an embodiment of the present application, the organic electronic device may be an OLED. When the organic electronic device is an OLED, the organic electronic device, for example, may have a structure in which the organic layer at least including a light-emitting layer is interposed between the hole injecting electrode layer and the electron injecting electrode layer. The hole injecting electrode layer and electron injecting electrode layer may be electrode layers on the scattering layer of the above-described substrate.

In the OLED, the organic layer existing between the electron and hole injecting electrode layers may include at least one layer of the light-emitting layer. The organic layer may include a plurality of two or more light-emitting layers.

When two or more light-emitting layers are included in the organic layer, the light-emitting layers may have a structure divided by an intermediate electrode, a charge generating layer (CGL), or the like having charge generating properties, but they are not limited thereto.

The light-emitting layer, for example, may be formed using various fluorescent or phosphorescent organic materials which are well-known in the field. Examples of the materials which may be used in the light-emitting layer may include a Alq-based material such as tris(4-methyl-8-quinolinolate) aluminum(III)(Alg3), 4-MAlq3, Gaq3, or the like, a cyclopenadiene derivative such as C-545T($C_{26}H_{26}N_2O_2S$), DSA-amine, TBSA, BTP, PAP-NPA, spiro-FPA, Ph3Si (PhTDAOXD), 1,2,3,4,5-pentaphenyl-1,3-cyclopentadiene (PPCP), or the like, DPVBi(4,4'-bis(2,2'-diphenylyinyl)-1,1'-biphenyl), distyryl benzene or derivatives thereof, DCJTB (4-(Dicyanomethylene)-2-tert-butyl-6-(1,1,7,7,-tetramethyl-julolidyl-9-enyl)-4H-pyran), DDP, AAAP, NPAMLI, a phosphorescent material such as Firpic, m-Firpic, N-Firpic, $bon_2Ir$ (acac), $(C_6)_2Ir$(acac), $bt_2Ir$(acac), $dp_2Ir$(acac), $bzq_2Ir$(acac), $bo_2Ir$(acac), $F_2Ir$(bpy), $F_2Ir$(acac), $op_2Ir$(acac), $ppy_2Ir$(acac), $tpy_2Ir$(acac), FIrppy(fac-tris[2-(4,5'-difluorophenyl)pyridine-C'2,N] iridium(III)), $Btp_2Ir$(acac) (bis(2-(2'-benzo[4,5-a]thienyl)pyridinato-N,C3')iridium(acetylactonate)), or the like, but are not limited thereto. The light-emitting layer may have a host-dopant system in which the above-described materials are included as a host, and also perylene, distyrylbiphenyl(distyrylbiphenyl), DPT, quinacridone, rubrene, BTX, ABTX, DCJTB, or the like are included as a dopant.

The light-emitting layer may be formed by suitably using a type of a compound exhibiting light-emitting properties in the electron accepting organic compounds or electron donating organic compounds which will be described below.

The organic layer may be formed to have various structures in which various functional layers well-known in the field are further included as long as the organic layer includes a light-emitting layer. Examples of the layers which may be included in the organic layer may include an electron injection layer, a hole blocking layer, an electron transfer layer, a hole transfer layer, a hole injection layer, etc.

The electron injection layer or electron transfer layer, for example, may be formed using an electron accepting organic compound. In the above description, a well-known arbitrary compound may be used as the electron accepting organic compound without particular limitation. Examples of the above-described organic compounds may include a polycyclic compound such as p-terphenyl, quaterphenyl, or the like, or a derivative thereof, a polycyclic hydrocarbon compound such as naphthalene, tetracene, pyrene, coronene, chrysene, anthracene, diphenylanthracene, naphthacene, phenanthrene, or the like, or a derivative thereof, a heterocyclic compound such as phenanthroline, bathophenanthroline, phenanthridine, acridine, quinoline, quinoxaline, phenazine, or the like, or a derivative thereof. Further, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, an imine, diphenylethylene, vinylanthracene, diaminocarbazole, pyrane, thiopyrane, polymethine, merocyanine, quinacridone, rubrene, or the like, or derivatives thereof, a metal chelate complex compound disclosed in disclosures such as Japanese Patent Application Laid-open Nos. 1988-295695, Japanese Patent Application Laid-open Nos. 1996-22557, Japanese Patent Application Laid-open Nos. 1996-81472, Japanese Patent Application Laid-open Nos. 1993-009470, Japanese Patent Application Laid-open Nos. 1993-017764 or the like, for example, such as a metal complex having one or more ligands of 8-quinolinolato such as tris(8-quinolinolato)aluminum[tris(8-quinolinolato)aluminium], bis(8-quinolinolato)magnesium, bis[benzo(f)-8-quinolinolato]zinc{bis[benzo(f)-8-quinolinolato]zinc}, bis(2-methyl-8-quinolinolato)aluminum, tris(8-quinolinolato)indium[tris(8-quinolinolato)indium], tris(5-methyl-8-quinolinolato)aluminum, 8-quinolinolatolithium, tris(5-chloro-8-quinolinolato)gallium, bis(5-chloro-8-quinolinolato)calcium, or the like or a derivative thereof, which are metal chelated oxanoid compounds, may be used.

An oxadiazole compound disclosed in disclosures such as Japanese Patent Application Laid-open Nos. 1993-202011, Japanese Patent Application Laid-open Nos. 1995-179394, Japanese Patent Application Laid-open Nos. 1995-278124, Japanese Patent Application Laid-open Nos. 1995-228579, or the like, a triazine compound disclosed in a disclosure such as Japanese Patent Application Laid-open Nos. 1995-157473, a derivative of stilbene or a derivative of distyrylarylene disclosed in a disclosure such as Japanese Patent Application Laid-open Nos. 1994-203963, a derivative of styryl disclosed in disclosures such as Japanese Patent Application Laid-open Nos. 1994-132080, Japanese Patent Application Laid-open Nos. 1994-88072, or the like, a derivative of diolefin disclosed in disclosures such as Japanese Patent Application Laid-open Nos. 1994-100857, Japanese Patent Application Laid-open Nos. 1994-207170, or the like; a fluorescent whitening agent such as a benzooxazole compound, a benzothiazole compound, a benzoimidazole compound, or the like; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, 1,4-bis(2-methylstyryl)-2-ethylbenzene, or the like; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, 2,5-bis[2-(1-pyrenyl)vinyl]pyrazine, or the like, a dimethylidine compound such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terphenylenedimetelidine, 9,10-anthracenediyldimethylidine, 4,4'-(2,2-di-t-butylphenylvinyl)biphenyl, 4,4'-(2,2-diphenylvinyl)biphenyl, or the like, or a derivative thereof, a derivative of silanamine disclosed in disclosures such as Japanese Patent Application Laid-open Nos. 1994-49079, Japanese Patent Application Laid-open Nos. 1994-293778, or the like, a multifunctional styryl compound disclosed in disclosures such as Japanese Patent Application Laid-open Nos. 1994-279322, Japanese Patent Application Laid-open Nos. 1994-279323, or the like, a derivative of oxadiazole disclosed in disclosures such as Japanese Patent Application Laid-open Nos. 1994-107648, Japanese Patent Application Laid-open Nos. 1994-092947, or the like, an anthracene compound disclosed in a disclosure such as Japanese Patent Application Laid-open Nos. 1994-206865, or the like, a derivative of oxynate disclosed in a disclosure such as Japanese Patent Application Laid-open Nos. 1994-145146, or the like, a tetraphenylbutadiene compound disclosed in a disclosure such as Japanese Patent Application Laid-open Nos. 1992-96990, or the like, an organic trifunctional compound disclosed in a disclosure such as Japanese Patent Application Laid-open Nos. 1991-296595, or the like, a derivative of coumarin disclosed in a disclosure such as Japanese Patent Application Laid-open Nos. 1990-191694, or the like, a derivative of perylene disclosed in a disclosure such as Japanese Patent Application Laid-open Nos. 1990-196885, or the like, a derivative of naphthalene disclosed in a disclosure such as Japanese Patent Application Laid-open Nos. 1990-255789, or the like, a derivative of phthaloperynone disclosed in disclosures such as Japanese Patent Application Laid-open Nos. 1990-289676, Japanese Patent Application Laid-open Nos. 1990-88689, or the like, or a derivative of styrylamine disclosed in a disclosure such as or Japanese Patent Application Laid-open Nos. 1990-250292, or the like, may be used as an electron accepting organic compound included in a low refractive layer. Further, the electron injection layer in the above description, for example, may be formed using materials such as LiF, CsF, or the like.

The hole blocking layer is a layer which may prevent holes injected from the hole injecting electrode from passing through the light-emitting layer and entering the electron injecting electrode, thus improving the lifetime and effectiveness of the device, and may be formed in a suitable part between the light-emitting layer and electron injecting electrode using well-known materials as needed.

The hole injection layer or hole transfer layer, for example, may include an electron donating organic compound. As the electron donating organic compound, an aryl amine compound such as N,N,N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl [4,4'-bis(diphenylamino)quadriphenyl], 4-N,N-diphenylamino-(2-diphenylvinyl)benzene, 3-methoxy-4'-N,N-diphenylaminostylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N-tetraphenyl-4,4'-diaminobiphenyl N-phenylcarbazole, 4,4'-bis[N-(1-naphthyl)-N-phenylamino]biphenyl, 4,4'-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4'-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl(4,4'-bis[N-(1-coronenyl)-N-phenylamino]biphenyl), 2,6-bis(di-p-tolylamino)naphthalene, 2,6-bis[di-(1-naphthyl)amino]

naphthalene, 2,6-bis[N-(1-naphthyl)-N-(2-naphthyl)amino]naphthalene, 4,4'-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene or 4,4'-bis(N,N-di-p-tolylamino)terphenyl, bis(N-1-naphthyl)(N-2-naphthyl)amine, or the like may be representatively exemplified, but the electron donating organic compound is not limited thereto.

The hole injection layer or hole transfer layer may be formed by dispersing the organic compound into a polymer, or using a polymer derived from the organic compound. Further, a so called π-conjugated polymer such as a polyparaphenylenevinylene and a derivative thereof, a hole transferring non-conjugated polymer such as a poly(N-vinylcarbazole) or the like, a σ-conjugated polymer such as a polysilane or the like may also be used.

The hole injection layer may be formed using a metal phthalocyanine such as copper phthalocyanine, a non-metal phthalocyanine, a carbon layer, and an electrically conductive polymer such as a polyaniline or the like, or may be formed by reacting an aryl amine compound as an oxidant with a Lewis acid.

The OLED may exemplarily have a form of (1) hole injecting electrode layer/organic light-emitting layer/electron injecting electrode layer; (2) hole injecting electrode layer/hole injection layer/an organic light-emitting layer/electron injecting electrode layer; (3) hole injecting electrode layer/organic light-emitting layer/electron injection layer/electron injecting electrode layer; (4) hole injecting electrode layer/hole injection layer/organic light-emitting layer/electron injection layer/electron injecting electrode layer; (5) hole injecting electrode layer/organic semiconductor layer/organic light-emitting layer/electron injecting electrode layer; (6) hole injecting electrode layer/organic semiconductor layer/electron blocking layer/organic light-emitting layer/electron injecting electrode layer; (7) hole injecting electrode layer/organic semiconductor layer/organic light-emitting layer/adhesion improving layer/electron injecting electrode layer; (8) hole injecting electrode layer/hole injection layer/hole transfer layer/organic light-emitting layer/electron injection layer/electron injecting electrode layer; (9) hole injecting electrode layer/insulating layer/organic light-emitting layer/insulating layer/electron injecting electrode layer; (10) hole injecting electrode layer/inorganic semiconductor layer/insulating layer/organic light-emitting layer/insulating layer/electron injecting electrode layer; (11) hole injecting electrode layer/organic semiconductor layer/insulating layer/an organic light-emitting layer/insulating layer/electron injecting electrode layer a form of; (12) hole injecting electrode layer/insulating layer/hole injection layer/hole transfer layer/organic light-emitting layer/insulating layer/electron injecting electrode layer, or (13) hole injecting electrode layer/insulating layer/hole injection layer/hole transfer layer/organic light-emitting layer/electron injection layer/electron injecting electrode layer, which are sequentially formed on the scattering layer of the substrate, and may have a form of including the organic layer with the structure in which at least two light-emitting layers which are divided by an intermediate electrode layer or charge generating layer (CGL) having charge-generating properties are disposed between the hole injecting electrode layer and electron injecting electrode layer, but is not limited thereto.

Various materials to form a hole or electron injecting electrode layer and an organic layer, for example, such as a light-emitting layer, an electron injection or a transfer layer, a hole injection or transfer layer, and various methods to form the same are known in this field, and all the methods as described above may be applied in the production of the organic electronic device.

The organic electronic device may further include an encapsulating structure. The encapsulating structure may be a protective structure to prevent foreign materials such as moisture, oxygen, or the like from penetrating the organic layer of the organic electronic device. The encapsulating structure, for example, may be a can such as a glass can, a metal can, or the like, or a film covering an entire surface of the organic layer.

FIG. 5 exemplarily shows the organic layer 701 and the second electrode layer 702 formed on the substrate including the base layer 101, and the scattering layer 102 and the first electrode layer 501, which are sequentially formed, are protected with the encapsulating structure 703 with a can structure such as a glass can, a metal can, etc. The encapsulating structure 703 in FIG. 5, for example, may be adhered by an adhesive. The encapsulating structure 703, for example, may be adhered to the electrode layer 501 not having the scattering layer 102 thereunder. For example, the encapsulating structure 703 as shown in FIG. 2 may be adhered to an end of the substrate by an adhesive. By the above-described methods, a protective effect of the encapsulating structure may be maximized.

The encapsulating structure, for example, may be a film covering an entire surface of the organic layer and the second electrode layer. FIG. 6 shows an exemplary encapsulating structure 703 in the form of the film covering an entire surface of the organic layer 701 and the second electrode layer 702. For example, a film-form encapsulating structure 703 may have a structure of bonding the substrate which includes the base layer 101, the scattering layer 102, and the electrode layer 501, to the second substrate 801 on the substrate, while covering the organic layer 701 and the second electrode layer 702 as shown in FIG. 6. Examples of the second substrate 801 may include, for example, a glass substrate, a metal substrate, a polymer film, a barrier layer, etc. The film-form encapsulating structure, for example, may be formed by applying a liquid material such as an epoxy resin or the like which is cured by heat, irradiating with ultraviolet rays or the like, and by curing the liquid material, or may be formed through a method of laminating the substrate and the upper substrate using an adhesive sheet or the like which is prepared in the film form using the epoxy resin or the like in advance, etc.

The encapsulating structure may include a metal oxide such as calcium oxide, beryllium oxide, or the like, a metal halide such as calcium chloride or the like, a moisture absorbent such as phosphorus pentoxide or the like, a getter material, and so forth as needed. The moisture absorbent or getter material, for example, may be included in the film-form encapsulating structure, or may be present at a predetermined position of the encapsulating structure of a can. Further, the encapsulating structure may additionally include a barrier film or conductive film.

The encapsulating structure, for example, as shown in FIG. 5 or 6, may be adhered on the first electrode layer 501 not having the scattering layer 102 thereunder. Accordingly, the sealing structure in which the scattering layer is not exposed to the outside may be realized. The sealing structure may denote, for example, a state in which the scattering layer is not exposed to the outside because an entire surface of the scattering layer is surrounded by the base layer, the electrode layer and/or the encapsulating structure, or an entire surface of the scattering layer is surrounded by the sealing structure formed including the base layer, the electrode layer and/or the encapsulating structure. The sealing structure may be formed including the base layer, the electrode layer, and the encapsulating structure, and further including other elements such as an auxiliary electrode or the like as long as the scattering layer is not exposed to the outside. For example, in FIG. 5 or 6, other elements may be present at the part in which the base layer 101 contacts the electrode layer 501, the part in which the electrode layer 501 contacts the encapsulating structure 703, or other parts. Examples of the other elements may include an organic material, an inorganic material or an organic and inorganic composite material having low moisture permeability, an insulating layer, an auxiliary electrode, etc.

The present application also relates to the use of an organic electronic device, for example, an OLED. The organic light emitting device, for example, may be effectively applied to a light source of backlight of a liquid crystal display (LCD) device, a lighting device, all types of sensors, a printer, a copy machine, or the like, a light source of vehicle instruments, a light source of signal light, a pilot light, a display unit, an in-plane luminous body, a display, a decoration, all types of lighting devices, etc. In an embodiment of the present application, the present application relates to a lighting device including the OLED. When the OLED is applied to the lighting device or for another use, other components forming the device or the method of forming the device are not particularly limited, all arbitrary materials or methods known in the related art may be utilized as long as the OLED is used.

Advantageous Effects

The present application relates to the substrate for the organic electronic device, the organic electronic device, and the lighting device. In the embodiment of the present application, the substrate or the organic electronic device capable of forming the organic electronic device which ensures the performance including light extraction efficiency or the like and reliability by applying the scattering layer capable of exhibiting different scattering properties according to the angle of incident light may be provided.

DESCRIPTION OF REFERENCE NUMERALS

Figure 1:
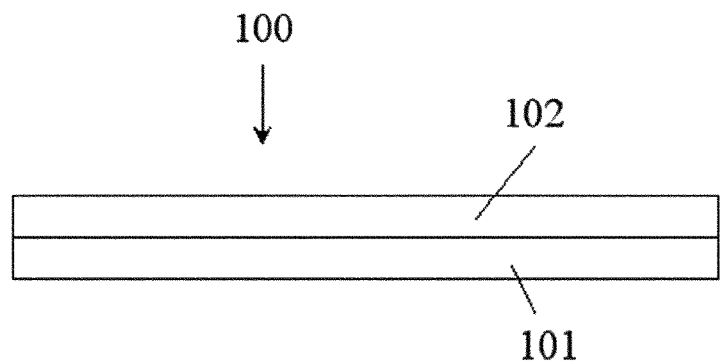
FIGS. 1 to 4 are mimetic diagrams showing an exemplary substrate.
Figure 2:
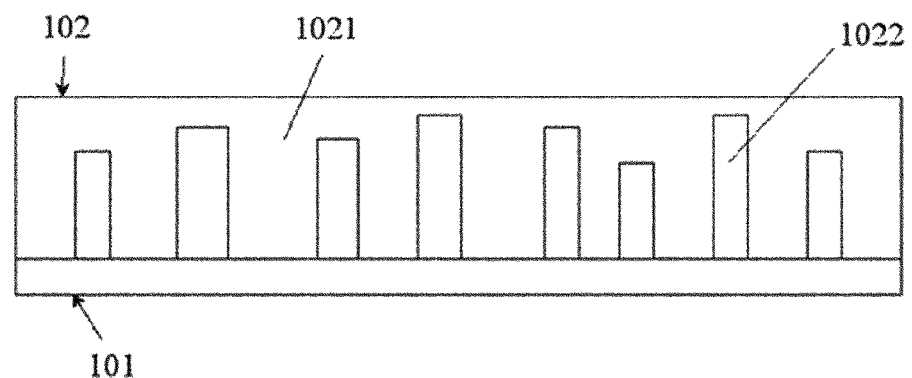
Figure 3:
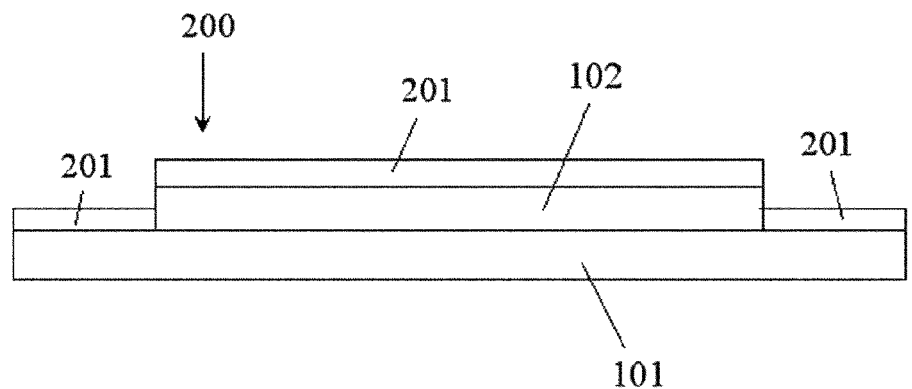
Figure 4:
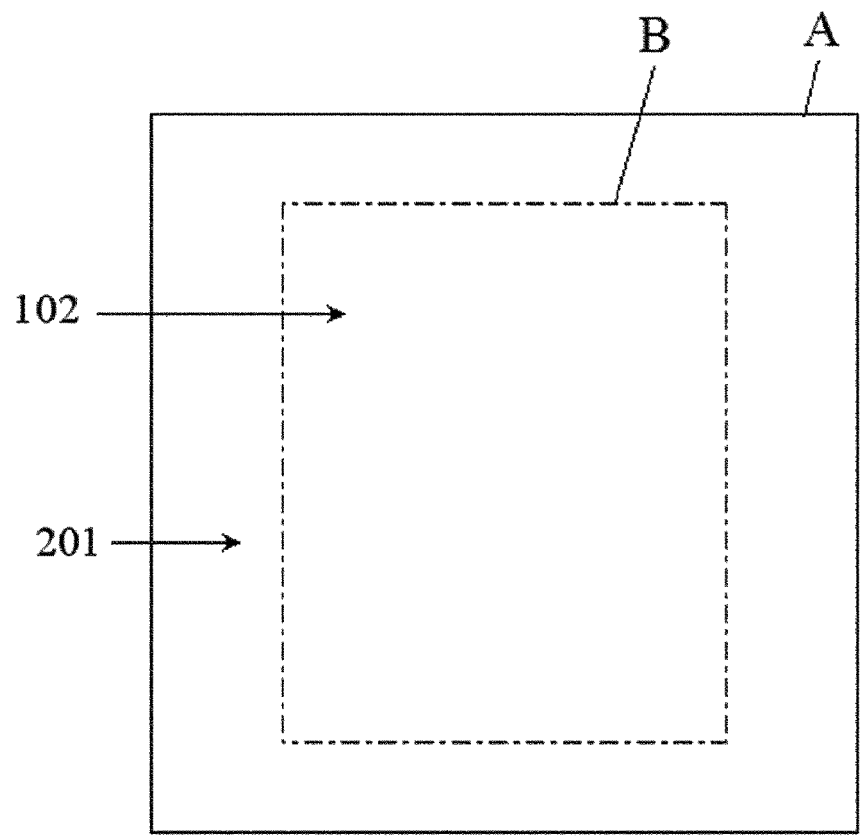
Figure 5:
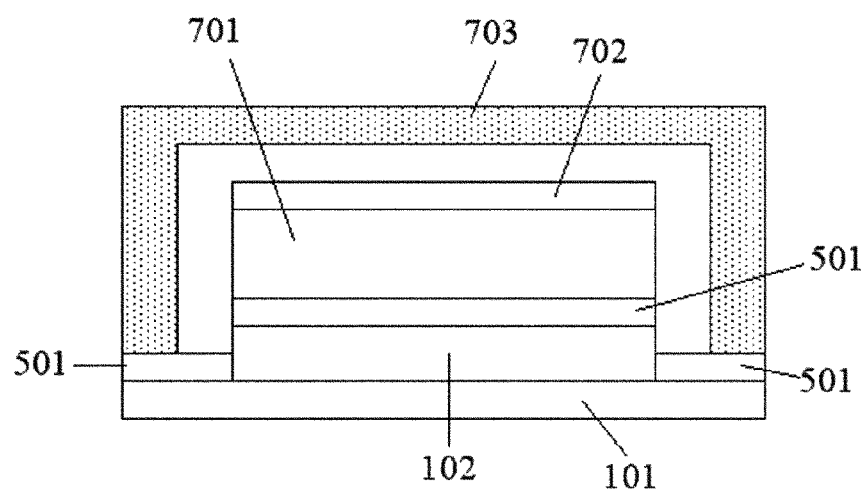
FIGS. 5 and 6 are mimetic diagrams showing an exemplary organic electronic device.
Figure 6:
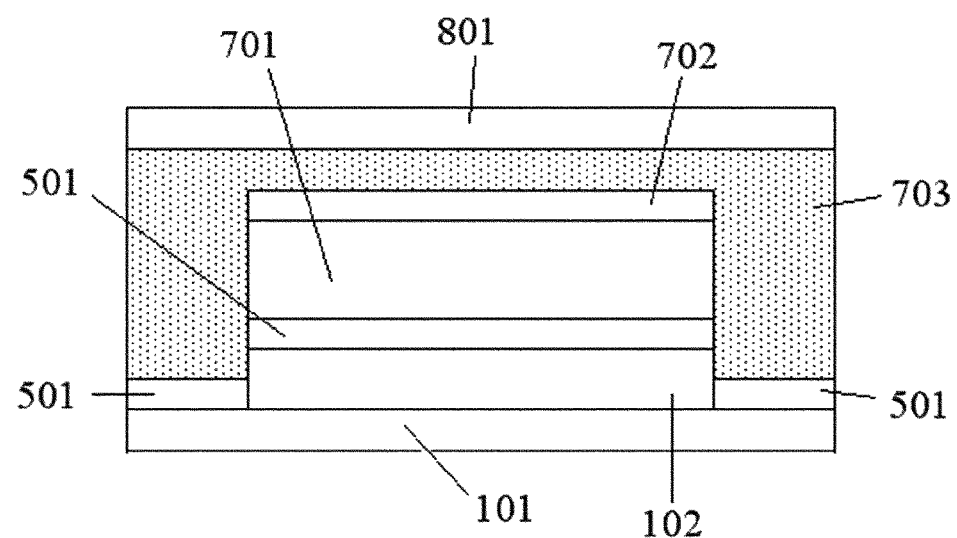

100: substrate for organic electronic device
101: base layer
102: scattering layer
1021: overcoat layer
1022: anisotropic nanostructure
201, 501: electrode layer
701: organic layer
702: electrode layer
703: encapsulating structure, encapsulating layer
801: cover substrate

MODES OF THE INVENTION

Hereinafter, the present application will be described in detail with conjunction with examples according to an embodiment of the present application and comparative examples not according to an embodiment of the present application, but the scope of the present application is not limited to the following examples.

EXAMPLE 1

Preparation of Substrate for Organic Electronic Device

Under an atmosphere of a mixture gas of oxygen ($O_2$) and argon, a layer of $TiO_2$ having a thickness of about 300 nm and having a refractive index of about 2.5 with respect to light with the wavelength of 550 nm was formed on a glass substrate using a reactive magnetron sputtering method using a titanium target. Then, a mask was formed by spin-coating a coating solution including nickel metal particles having an average diameter of about 120 nm, the layer of $TiO_2$ was etched through plasma using a $Cl_2$ gas, and the aluminum metal particles were removed using a mixture solution of a hydrochloric acid (HCl) and a nitric acid ($HNO_3$) to form a surface in which columns of $TiO_2$ having a height of about 300 nm and having a cross section with an average diameter of about 120 nm are randomly disposed. In the above description, the height and the average diameter of $TiO_2$ are measured through a Field Emission Scanning Electron Microscopy (FE-SEM) analysis. Subsequently, a tetramethoxy silane oligomer condensate was mixed with titanium oxide ($TiO_2$) particles having an average diameter of about 20 nm and a refractive index of about 2.5 with respect to light with the wavelength of 550 nm, the mixed condensate was dispersed into a mixture solvent of ethanol and methyl isobutyl ketone to prepare a coating solution, the glass substrate in which the $TiO_2$ columns were formed was coated with the coating solution using a slot die, dried at about 100° C. for about 1 minute, and cured by heat at about 200° C. for about 30 minutes to form an overcoat layer having a refractive index of about 1.8 with respect to light with the wavelength of 550 nm. Then, a hole injecting electrode layer including indium tin oxide (ITO) was formed on an entire surface of the glass substrate using a well-known sputtering method, and thereby a substrate was prepared.

Preparation of Organic Light Emitting Device

A hole injection layer including alpha-NPD(N,N'-Di-[(1-naphthyl)-N,N'-diphenyl]-1,1'-biphenyl)-4,4'-diamine) and a light-emitting layer (4,4',4'-tris(N-carbazolyl)-triphenylamine (TCTA):Firpic, TCTA:Fir6) were sequentially formed on an electrode layer of the prepared substrate using a deposition method. Subsequently, TCTA(4,4',4'-tris(N-carbazolyl)-triphenylamine) which is an electron transferring compound was deposited on the light-emitting layer, and an electron injection layer having a thickness of about 70 nm was formed. Subsequently, an aluminum (Al) electrode as an electron injecting reflective electrode was formed on the electron injection layer using a vacuum deposition method, and thereby a device was prepared. Subsequently, an encapsulating structure was attached to the device in a glove box under an atmosphere of an argon (Ar) gas, and thereby an device was prepared.

EXAMPLE 2

Preparation of Substrate for Organic Electronic Device

A layer of $TiO_2$ having a thickness of about 400 nm and a refractive index of about 2.5 with respect to light with the wavelength of 550 nm was formed in the same manner as in Example 1. Then, a thin layer of Au having a thickness of about 10 nm was formed on the layer of $TiO_2$ using a heat deposition method, annealed at 600° C. for about 3 minutes using a rapid thermal annealing (RTA) device, and thereby a random arrangement of Au particles having an average diameter of about 200 nm was formed on the layer of $TiO_2$. Subsequently, the layer of $TiO_2$ was etched through plasma using a $SF_6$ gas, and the Au particles were removed using a mixture solution of a hydrochloric acid (HCl) and a nitric acid ($HNO_3$) to form a surface in which columns of $TiO_2$ having a height of about 400 nm and having a cross section with an average diameter of about 200 nm are randomly disposed. Subsequently, the overcoat layer and the hole injecting electrode layer were formed in the same manner as in Example 1, and thereby a substrate was prepared.

Preparation of Organic Light Emitting Device

An device was prepared in the same manner as in Example 1 except that the prepared substrate was used.

COMPARATIVE EXAMPLE 1

An device was prepared by directly forming a hole injecting electrode layer, a light-emitting layer, an electron injection layer and an electron injecting reflective electrode in the same manner as in Example 1 except that the scattering layer was not formed on the glass substrate.

A result of a performance evaluation with respect to the examples and comparative example was as shown in the following Table 1. The evaluation of external quantum efficiency in the following Table 1 was performed using a well-known method.

TABLE 1

|  | Driving voltage (V) | External quantum efficiency (%) |
|---|---|---|
| Example 1 | 6.1 | 28.3 |
| Example 2 | 6.1 | 29.2 |
| Comparative Example 1 | 6.0 | 19.1 |

The invention claimed is:

1. A substrate for an organic electronic device comprising:
a base layer; and
a scattering layer disposed on the base layer, and comprising a pattern of anisotropic nanostructures having an aspect ratio in the range of 1.2 to 30, wherein the anisotropic nanostructure has a shape of a column having a length in the range of 50 to 1,000 nm, wherein the anisotropic nanostructure has a refractive index of 1.7 or more.

2. The substrate of claim 1, wherein the anisotropic nanostructure has a refractive index of 1.7 or more.

3. The substrate of claim 1, wherein the anisotropic nanostructure has a shape of a column having an average diameter of a cross section in the range of 10 to 500 nm.

4. The substrate of claim 1, wherein the anisotropic nanostructure comprises zinc oxide, zirconia, titania, silicon nitride, silicon nitride oxide, barium oxide, alumina, or vanadium pentoxide.

5. The substrate of claim 1, wherein the plurality of anisotropic nanostructures are randomly disposed on the base layer.

6. The substrate of claim 5, wherein the plurality of anisotropic nanostructures comprises two types or more of anisotropic nanostructures having different aspect ratios from each other.

7. The substrate of claim 1, further comprising an overcoat layer which is present on an upper part of the pattern of the anisotropic nanostructure.

8. The substrate of claim 7, wherein the overcoat layer has a refractive index in the range of 1.2 to 3.5.

9. The substrate of claim 7, wherein the overcoat layer comprises a polysiloxane, a polyamic acid, or a polyimide.

10. The substrate of claim 7, wherein the anisotropic nanostructure has a refractive index higher than the overcoat layer.

11. The substrate of claim 10, wherein a difference in the refractive indexes of the anisotropic nanostructure and the overcoat layer is in the range of 0.2 to 2.0.

12. The substrate of claim 1, further comprising an electrode layer formed on the scattering layer.

13. The substrate of claim 12, wherein the scattering layer is sealed by the electrode layer and the base layer.

14. A substrate for an organic electronic device comprising:
a base layer; and
a scattering layer disposed on the base layer, and comprising a pattern of anisotropic nanostructures having an aspect ratio in the range of 1.2 to 30, wherein the plurality of anisotropic nanostructures are randomly disposed on the base layer, and
wherein an average interval between the plurality of anisotropic nanostructures which are randomly disposed is in the range of 150 to 300 nm, and wherein the anisotropic nanostructure has a refractive index of 1.7 or more.

15. A substrate for an organic electronic device comprising:
a base layer; and
a scattering layer disposed on the base layer, and comprising a pattern of anisotropic nanostructures having an aspect ratio in the range of 1.2 to 30, wherein an area occupied by the anisotropic nanostructures accounts for 20 to 70% with respect an entire area of the scattering layer when observed from an upper side.

16. An organic electronic device comprising:
a base layer;
a first electrode layer, an organic layer comprising a light-emitting layer, and a second electrode layer, which are sequentially formed on the base layer; and
a layer interposed between the base layer and the first electrode layer, or between the second electrode layer and the organic layer, and comprising a pattern of an anisotropic nanostructure having an aspect ratio in the range of 1.2 to 30, wherein the anisotropic nanostructure has a shape of a column having a length in the range of 50 to 1,000 nm, wherein the anisotropic nanostructure has a refractive index of 1.7 or more.

17. A lighting device comprising the organic electronic device of claim 16.

18. An organic electronic device comprising:
a base layer;
a first electrode layer, an organic layer comprising a light-emitting layer, and a second electrode layer, which are sequentially formed on the base layer; and
a layer interposed between the base layer and the first electrode layer, or between the second electrode layer and the organic layer, and comprising a pattern of an anisotropic nanostructure having an aspect ratio in the range of 1.2 to 30, wherein the plurality of anisotropic nanostructures are randomly disposed on the base layer, and
wherein an average interval between the plurality of anisotropic nanostructures which are randomly disposed is in the range of 150to 300 nm, and wherein the anisotropic nanostructure has a refractive index of 1.7 or more.

19. An organic electronic device comprising:
a base layer;

a first electrode layer, an organic layer comprising a light-emitting layer, and a second electrode layer, which are sequentially formed on the base layer; and a layer interposed between the base layer and the first electrode layer, or between the second electrode layer and the organic layer, and comprising a pattern of an anisotropic nanostructure having an aspect ratio in the range of 1.2 to 30, and wherein an area occupied by the anisotropic nanostructures accounts for 20 to 70% with respect an entire area of the scattering layer when observed from an upper side.

* * * * *